(12) United States Patent
Huang

(10) Patent No.: US 11,227,865 B2
(45) Date of Patent: Jan. 18, 2022

(54) SEMICONDUCTOR DEVICE HAVING BURIED WORD LINE AND METHOD OF MANUFACTURING THE SAME

(71) Applicant: NANYA TECHNOLOGY CORPORATION, New Taipei (TW)

(72) Inventor: Chih-Wei Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 112 days.

(21) Appl. No.: 16/782,354

(22) Filed: Feb. 5, 2020

(65) Prior Publication Data
US 2021/0242211 A1 Aug. 5, 2021

(51) Int. Cl.
| | |
|---|---|
| *H01L 21/76* | (2006.01) |
| *H01L 27/108* | (2006.01) |
| *H01L 23/528* | (2006.01) |
| *H01L 23/532* | (2006.01) |
| *H01L 21/768* | (2006.01) |
| *H01L 21/311* | (2006.01) |
| *H01L 21/762* | (2006.01) |

(52) U.S. Cl.
CPC .. *H01L 27/10823* (2013.01); *H01L 21/31116* (2013.01); *H01L 21/7682* (2013.01); *H01L 21/76224* (2013.01); *H01L 21/76802* (2013.01); *H01L 21/76843* (2013.01); *H01L 23/5283* (2013.01); *H01L 23/53295* (2013.01); *H01L 27/10876* (2013.01); *H01L 27/10891* (2013.01)

(58) Field of Classification Search
None
See application file for complete search history.

(56) References Cited

U.S. PATENT DOCUMENTS

| | | | |
|---|---|---|---|
| 2011/0024815 A1* | 2/2011 | Kim | H01L 27/10891 257/302 |
| 2016/0336413 A1* | 11/2016 | Wu | H01L 29/78 |
| 2017/0200722 A1* | 7/2017 | Wu | H01L 29/0649 |

* cited by examiner

*Primary Examiner* — Bradley Smith
(74) *Attorney, Agent, or Firm* — Muncy, Geissler, Olds and Lowe, P.C.

(57) ABSTRACT

The present disclosure provides a semiconductor device. The semiconductor device can be a recessed access device (RAD) transistor, which includes a substrate, a word line disposed in the substrate and surrounded by a dielectric liner, an isolation layer disposed in the substrate to cap the word line, and an insulative plug penetrating through the isolation layer and extending into the word line.

9 Claims, 19 Drawing Sheets

SEMICONDUCTOR DEVICE HAVING BURIED WORD LINE AND METHOD OF MANUFACTURING THE SAME

TECHNICAL FIELD

The present disclosure relates to a semiconductor device having a buried word line and a method of manufacturing the same, and more particularly, to a recessed access device (RAD) transistor and a method of manufacturing the same.

DISCUSSION OF THE BACKGROUND

Manufacture of various semiconductor devices, such as memory devices, logic devices and microprocessors, has a common goal of miniaturization. As feature sizes decrease, the electrical operation of the transistor becomes more difficult. One contributing factor to such difficulty, the short channel effect, arises when the width of the transistor channel becomes excessively small due to miniaturization. This may result in the transistor activating even though a threshold voltage (Vt) has not been applied to the gate.

A new type of transistor, known as a recessed access device (RAD) transistor, has been developed to overcome the short-channel effect suffered by conventional transistors by forming a wider channel in the same horizontal space. The RAD transistor comprises a transistor gate (word line) that is partially formed within a trench in a semiconductor wafer. The channel region is formed along the entire surface of the trench, thereby providing a wider channel without increasing the amount of lateral space required by the transistor. However, with increases in DRAM bit density, the overlay between transistor gates and the source/drain junction depth create a challenge due to variations in the etching process.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device. The semiconductor device includes a substrate, a word line, a dielectric liner, an isolation layer and an insulative plug. The word line is disposed in the substrate. The dielectric liner is disposed between the substrate and the word line. The isolation layer is disposed in the substrate to cap the word line. The insulative plug penetrates through the isolation layer and extends into the word line.

In some embodiments, the insulative plug and the word line are concentric.

In some embodiments, the word line has a first width, and the insulative plug has a second width less than the first width.

In some embodiments, the second width gradually decreases at positions of increasing distance from an upper surface of the substrate.

In some embodiments, the insulative plug is entirely surrounded by the isolation layer.

In some embodiments, the insulative plug has a first dielectric constant, and the isolation layer has a second dielectric constant greater than the first dielectric constant.

In some embodiments, the semiconductor device further includes a void introduced in the isolation layer.

In some embodiments, the void extends around a perimeter of the insulative plug.

In some embodiments, the semiconductor device further includes a plurality of impurity regions in the substrate and disposed on either side of the word line.

Another aspect of the present disclosure provides a method of manufacturing a semiconductor device. The method includes steps of creating at least one trench in a substrate; depositing a conductive material to partially fill the trench; and forming an insulative piece in the trench and extending into the conductive material.

In some embodiments, the method further includes a step of depositing an isolation material in the trench to cap the conductive material exposed through the insulative piece.

In some embodiments, the depositing of the isolation material further comprises enclosing at least one void in the isolation material.

In some embodiments, the insulative piece and the isolation material have different dielectric constants.

In some embodiments, the forming of the insulative piece includes a step of depositing an insulative material in the trench coated with the conductive material.

In some embodiments, the method further includes a step of recessing the conductive material to form at least one word line if the insulative piece is entirely surrounded by the conductive material.

In some embodiments, the method further includes a step of depositing a dielectric film on the substrate and in the trench before the deposition of the conductive material.

In some embodiments, the method further includes a step of further comprising recessing the dielectric film to a level below a top surface of the word line.

In some embodiments, the method further includes steps of depositing a diffusion barrier layer on the dielectric film before the deposition of the conductive material; and recessing the diffusion barrier layer to a level below the top surface of the word line.

In some embodiments, the method further includes a step of introducing dopants into the substrate to form impurity regions, wherein the impurity regions are separated from each other by the trench.

With the above-mentioned configurations of a semiconductor device, the layer capping the word line is merged with the isolation layer having the relatively high dielectric constant and the insulative plug having a relatively low dielectric constant; as a result, the effective dielectric constant of the layer capping the word line can be reduced, thereby reducing the parasitic capacitances of the semiconductor device.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1A:
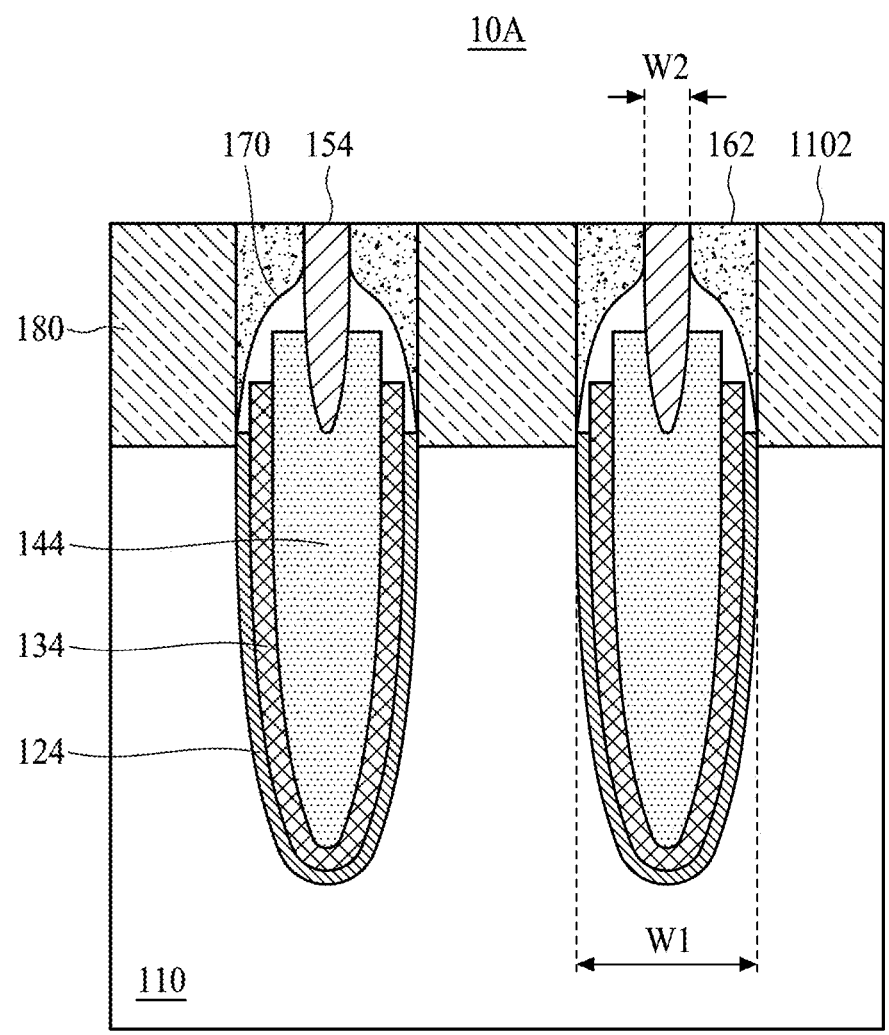
FIG. 1A is a cross-sectional view of a semiconductor device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1A is a cross-sectional view of a semiconductor device 10A in accordance with some embodiments of the present disclosure. Referring to FIG. 1A, the semiconductor device 10A is a recessed access device (RAD) transistor including a substrate 110, a plurality of word lines 144 disposed in the substrate 110 and surrounded by dielectric liners 124, a plurality of insulative plugs 154 disposed in the substrate 110 and extending into the word lines 144, respectively, and a plurality of impurity regions 180 disposed in the substrate 110 and on either side of the word lines 144, wherein the impurity regions 180 serve as source/drain regions of the RAD transistor. The dielectric liners 124, between the substrate 110 and the word lines 144, are employed to prevent junction leakage. In addition, the dielectric liners 124 can prevent dopants introduced in the impurity regions 180 from migrating into the word lines 144.

The semiconductor device 10A further includes an isolation layer 162 disposed in the substrate 110 and employed to cap the word lines 144. With the high integration of the semiconductor device 10A, the distance between the word lines 144 may be reduced. This may increase the parasitic capacitance between the word lines 144, and the performance of the semiconductor device 10A may be degraded. Therefore, a plurality of voids 170 that typically hold air, which has a dielectric constant or k value of about 1, can be introduced in the isolation layer 162 to reduce parasitic capacitance. Thus, the leakage current in the highly-integrated semiconductor device 10A may be further reduced, thereby improving performance of the semiconductor device 10A.

In some embodiments, the void 170, buried in the isolation layer 162, extends around the perimeter of the insulative plug 154. In some embodiments, the void 170 can separate at least a portion of the word line 144 from the isolation layer 162. In some embodiments, the isolation layer 162 capping the word line 144 may introduce a plurality of voids 170 having a low dielectric constant to reduce the parasitic capacitances. In some embodiments, the insulative plug 154 and the isolation layer 162 can includes the same dielectric material if one or more voids 170 are buried in the isolation layer 162. In alternative embodiments, the insulative plug 154 and the isolation layer 162 may include different dielectric materials; the isolation layer 162 can have a first dielectric constant, and the insulative plug 154 can have a second dielectric constant less than the first dielectric constant to further reduce the parasitic capacitance.

As shown in FIG. 1A, the word line 144, below an upper surface 1102 of the substrate 110, and the insulative plug 154 embedded in the word line 144 are concentric. In some embodiments, the word line 144 has a first width W1 (e.g., a top or maximum width), and the insulative plug 154 has a second width W2 (e.g., a top or maximum width) less than the first width W1. In some embodiments, the first width W1 and the second width W2 gradually decrease at positions of increasing distance from the upper surface 1102 of the substrate 110. In some embodiments, the semiconductor device 10A may also include a plurality of diffusion barrier liners 134 disposed between the dielectric liners 124 and the word lines 144. The diffusion barrier liners 134 are employed to prevent the word lines 144 from flaking or spalling from the dielectric liners 124.

Figure 1B:
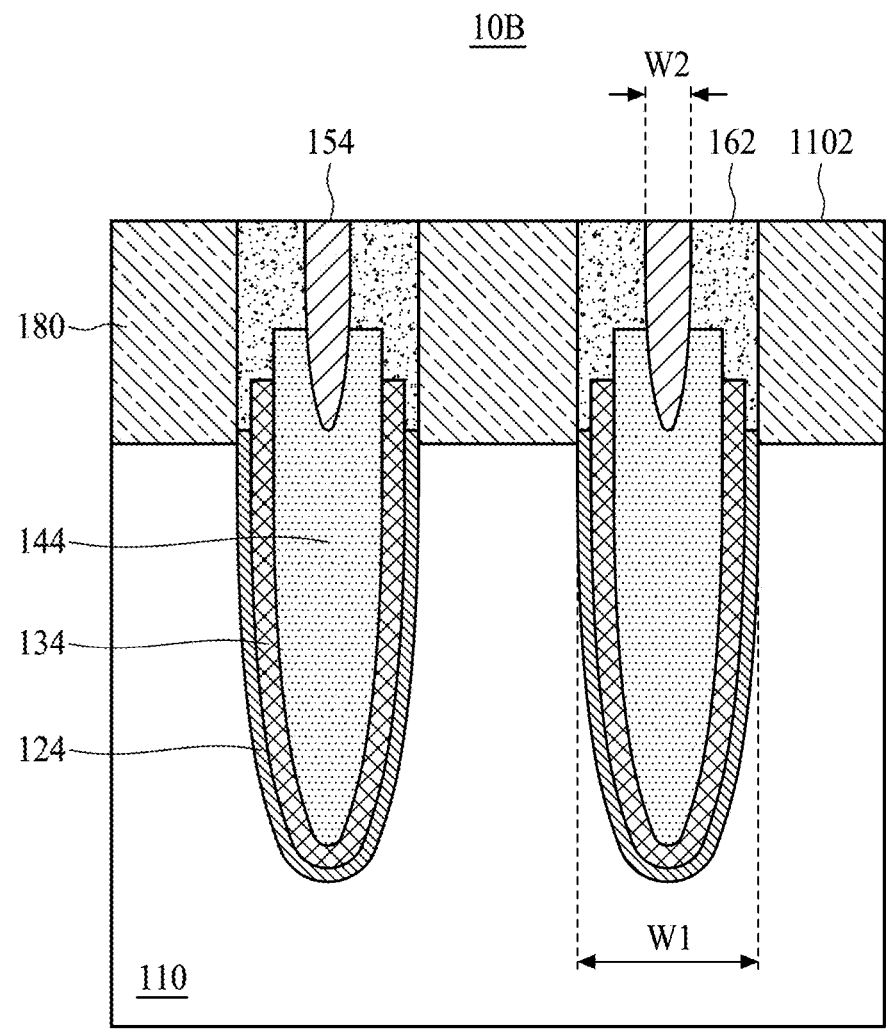
FIG. 1B is a cross-sectional view of a semiconductor device in accordance with some embodiments of the present disclosure.

FIG. 1B is a cross-sectional view of a semiconductor device 10B in accordance with some embodiments of the present disclosure. Referring to FIG. 1B, the semiconductor device 10B is a RAD transistor including a substrate 110, at least one word line 144 disposed in the substrate 110 and surrounded by a dielectric liner 124, at least one insulative plug 154 disposed in the substrate 110 and extending into the word line 144, an isolation layer 162 covering the word line 144 and enclosing the insulative plug 154, and a plurality of impurity regions 180 disposed on either side of the word line 144. The isolation layer 162 has a first dielectric constant, and the insulative plug 154, including nitride, has a second dielectric constant less than the first dielectric constant, so that an effective dielectric constant of the layer, merged with the insulative layer 152 and the isolation layer 162, capping the word line 144 can be reduced, thereby reducing the parasitic capacitances.

In some embodiments, the semiconductor device 10B further includes a diffusion barrier liner 134 sandwiched between the dielectric liner 124 and the word line 144, wherein the dielectric liner 124, the diffusion barrier liner 134 and the word line 144 are buried in the isolation layer 162, and the insulative plug 154 is entirely surrounded by the isolation layer 162. In other words, the isolation layer 162 in FIG. 1B is a void-free layer.

Figure 2:
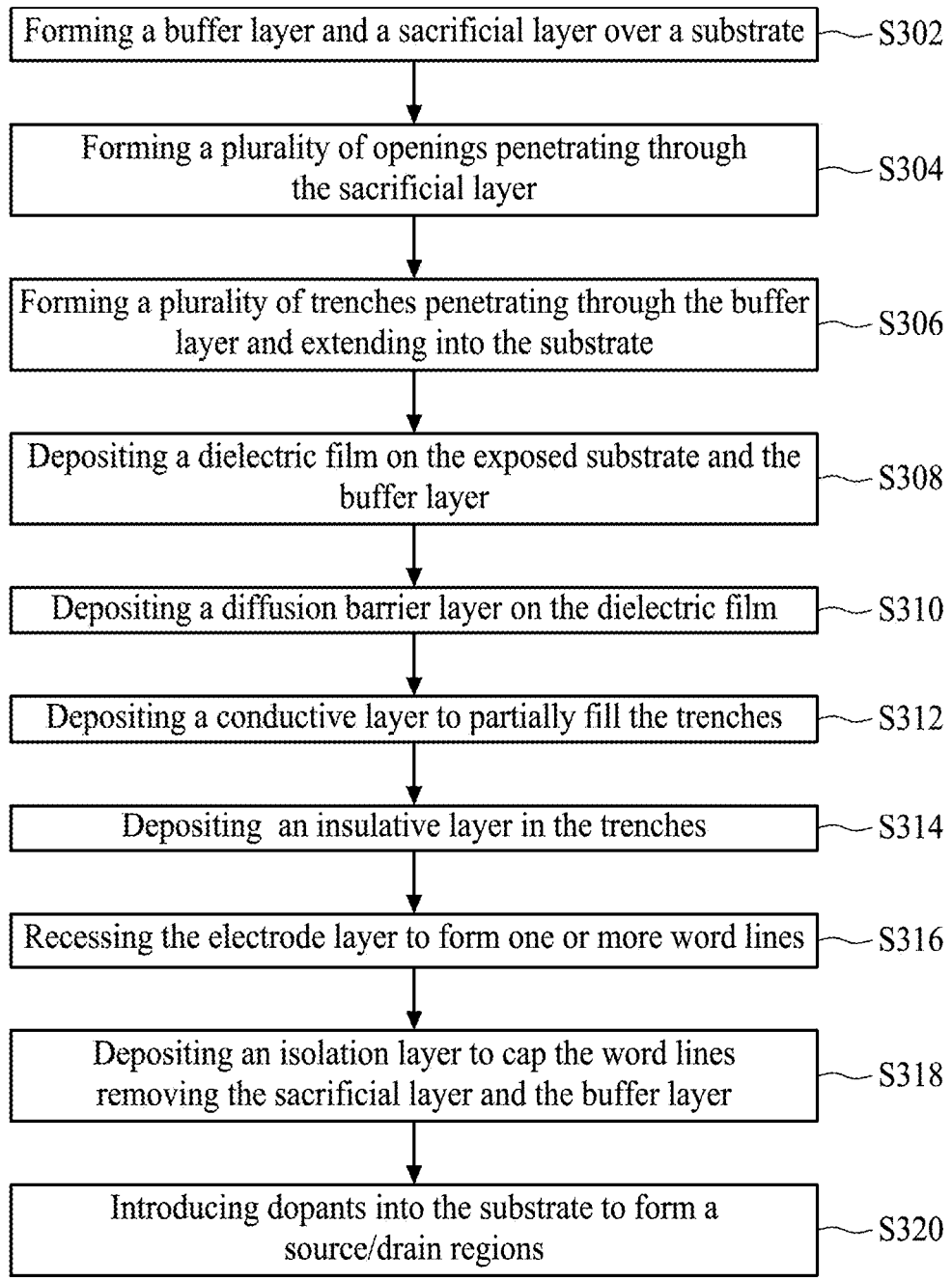
FIG. 2 is a flow diagram illustrating a method of manufacturing a semiconductor device in accordance with some embodiments of the present disclosure.

FIG. 2 is a flow diagram illustrating a method 300 of manufacturing a semiconductor structure in accordance with some embodiments of the present disclosure, and FIGS. 3 through 15B illustrate cross-sectional views of intermediate stages in the formation of semiconductor devices in accordance with some embodiments of the present disclosure. The stages shown in FIGS. 3 to 15B are also illustrated schematically in the flow diagram in FIG. 2. In the subsequent discussion, the fabrication stages shown in FIGS. 3 to 15B are discussed in reference to the process steps shown in FIG. 2.

Figure 3:
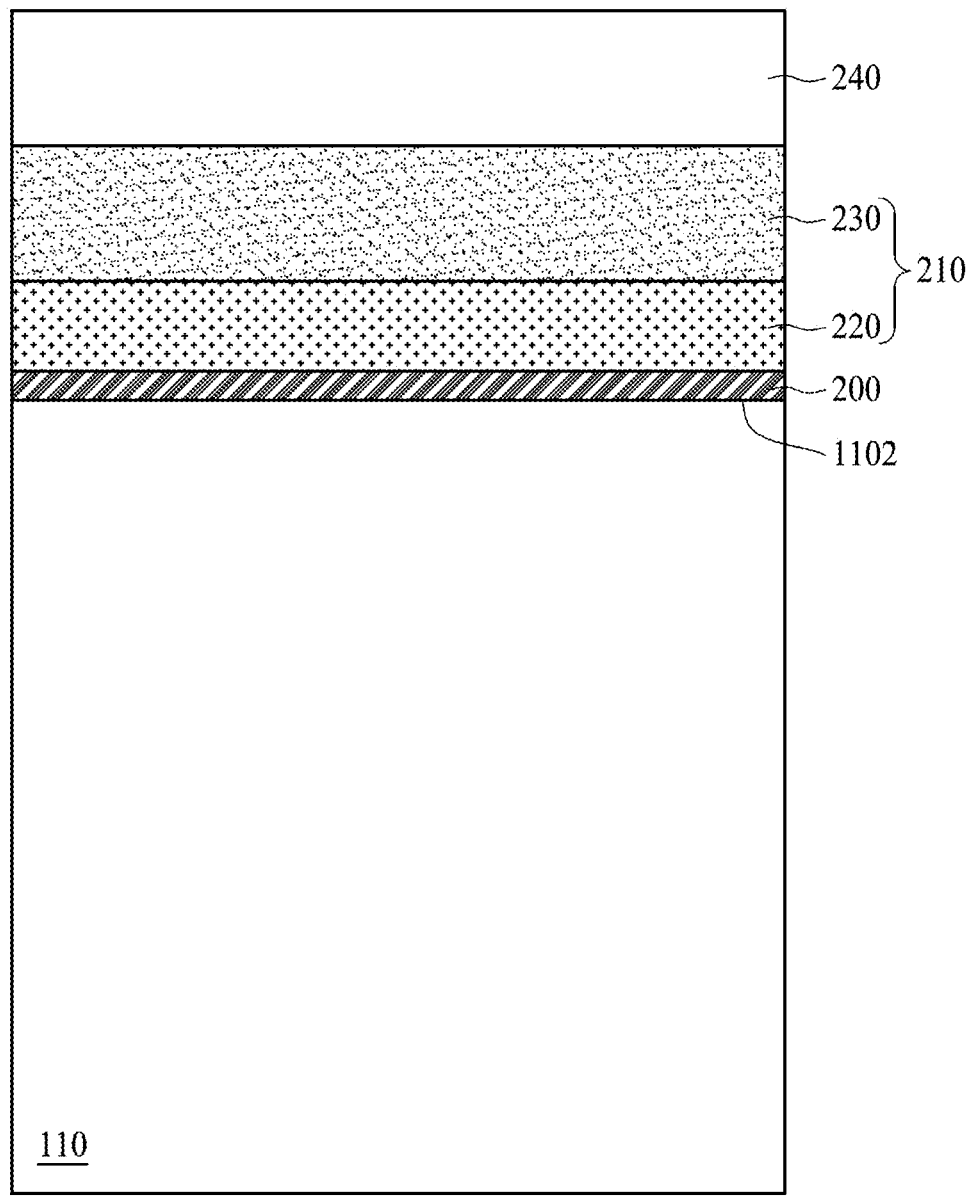
FIGS. 3 through 12 illustrate cross-sectional views of intermediate stages in the formation of a semiconductor device in accordance with some embodiments of the present disclosure.

Referring to FIG. 3, a buffer layer 200 and a sacrificial layer 210 are stacked on a substrate 110 according to a step S302 in FIG. 2. The substrate 110 is preferably made of semiconductor material; in some embodiments, the substrate 110 is formed of silicon-containing material. The buffer layer 200, formed on the entire upper surface 1102 of the substrate 110, protects against contamination and mitigates stress at the interface between the substrate 110 and the sacrificial layer 210. The buffer layer 200 can include silicon oxide or silicon dioxide. The buffer layer 200 is formed using a chemical vapor deposition (CVD) process or a thermal oxidation process. In other words, the buffer layer 200 can be a deposition layer or an oxidized layer, wherein the thermally grown oxides can display a higher level of purity than the deposited oxides.

The sacrificial layer 210 may include an underlying layer 220 and an overlying layer 230 sequentially deposited on the buffer layer 200, wherein the underlying layer 220 and the overlying layer 230 function as hard masks for patterning the buffer layer 200 and the substrate 110. In addition, the overlying layer 230 is employed as an anti-reflective coating (ARC) layer to minimize the optical reflection of the radiation used to expose a photoresist layer 240 coated on the overlying layer 230. In some embodiments, the underlying layer 220, including polysilicon, is formed using a CVD process. The overlying layer 230 may be formed of an inorganic material, including nitride, using a CVD process, a physical vapor deposition (PVD) process, a spin-coating process or an atomic layer deposition (ALD) process. The photoresist layer 240 is applied over the sacrificial layer 210 by a spin-coating process and then dried using a soft-baking process.

Figure 4:
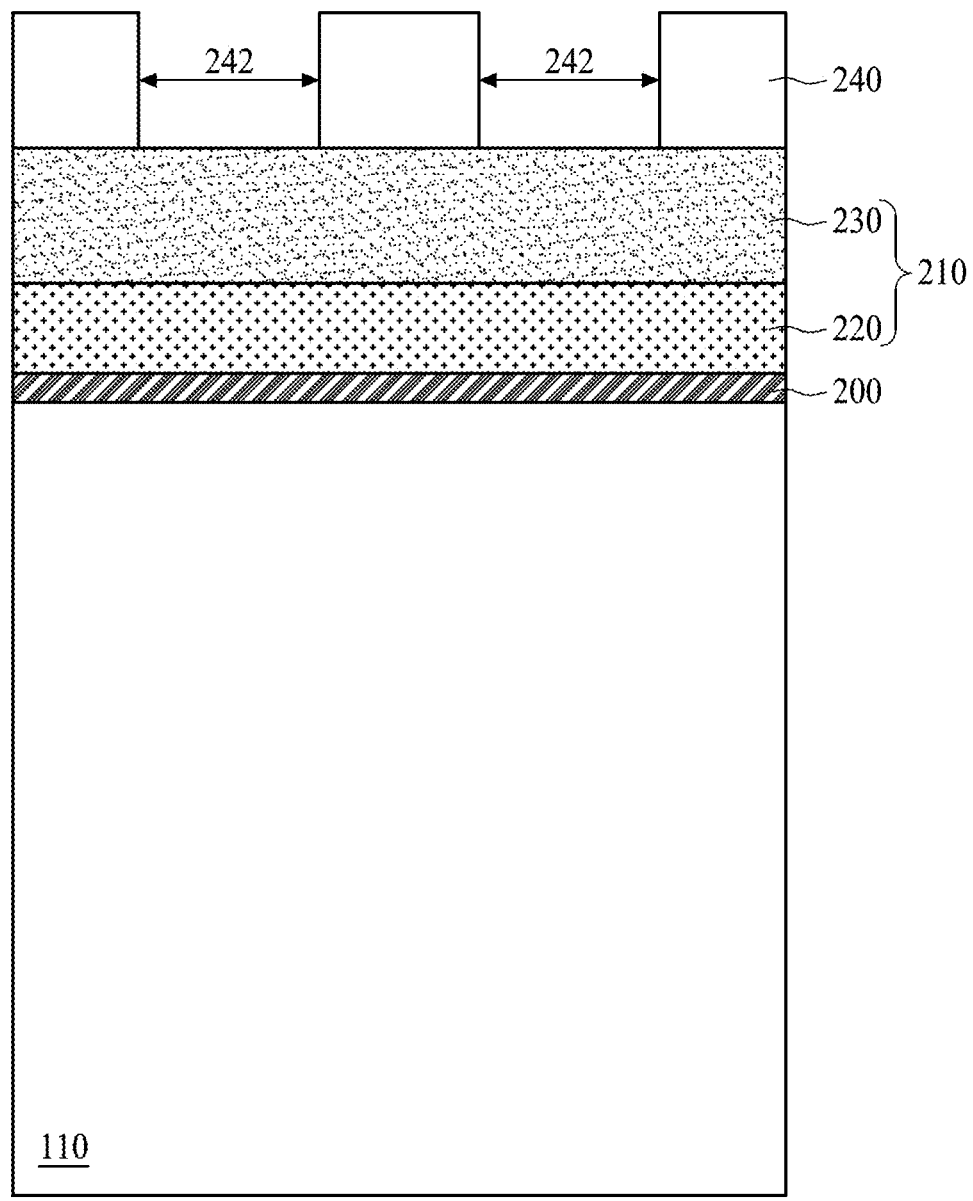
Figure 5:
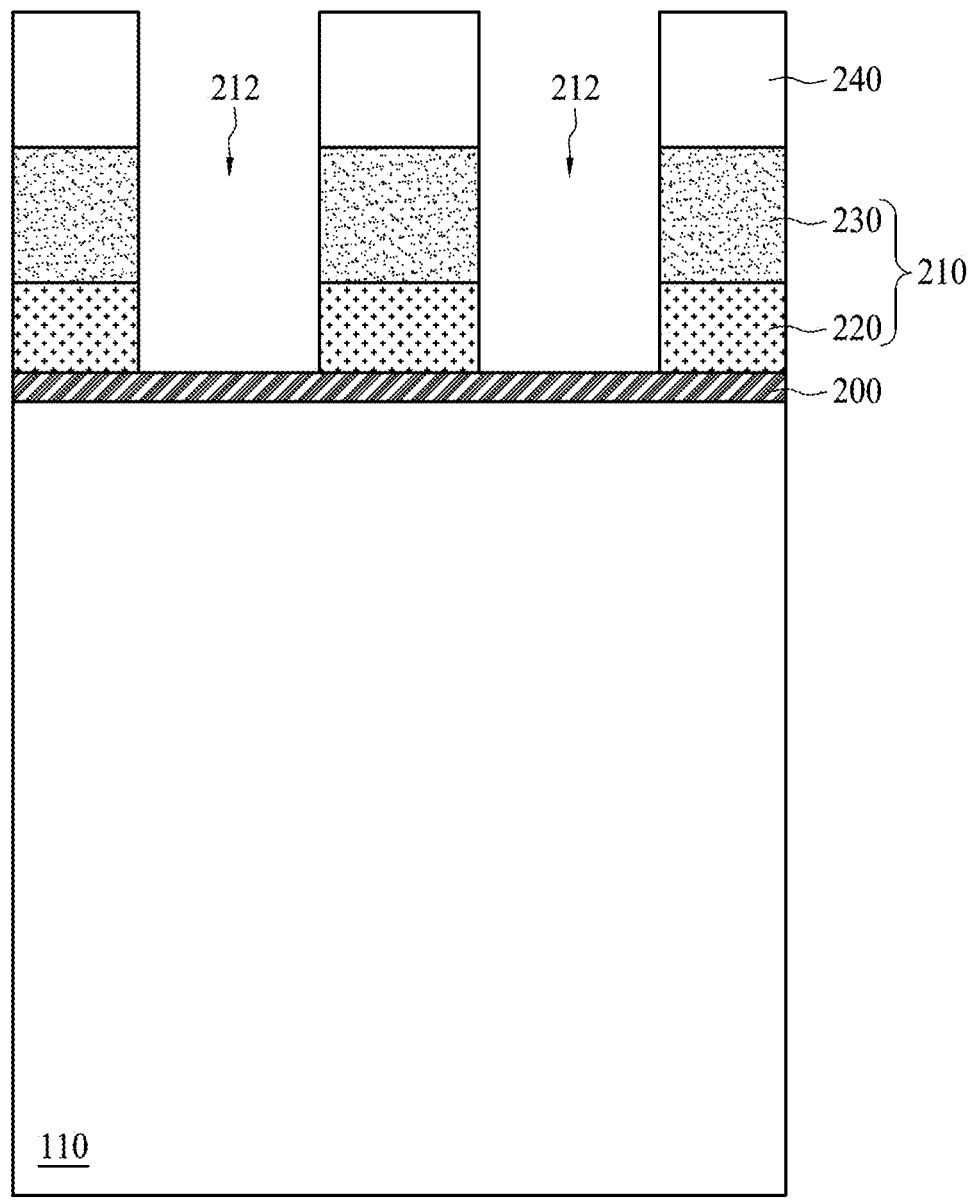

Referring to FIG. 4, the photoresist layer 240 is exposed and developed to form one or more windows 242 to expose portions of the overlying layer 230. Next, the overlying layer 230 and the underlying layer 220 are etched through the windows 242 to form one or more openings 212 penetrating through the sacrificial layer 210 according to a step S304 in FIG. 2. Consequently, portions of the buffer layer 200 are exposed, as shown in FIG. 5. Referring to FIGS. 4 and 5, the openings 212 are formed in the sacrificial layer 210 using at least one etching process to remove portions of the overlying layer 230 and portions of the underlying layer 220 not protected by the photoresist layer 240, and the overlying layer 230 can functions as a protective layer to protect the underlying layer 220 from damage during the performing of the etching process. In should be noted that the etching process may utilize multiple etchants, selected based on the materials of the underlying layer 220 and the overlying layer 230, to etch the sacrificial layer 210. In some embodiments, the buffer layer 200 may serve as an etch-stopping layer during the performing of the etching process. The photoresist layer 240 is removed using an ashing process or a strip process, for example, after the openings 212 are formed.

Figure 6:
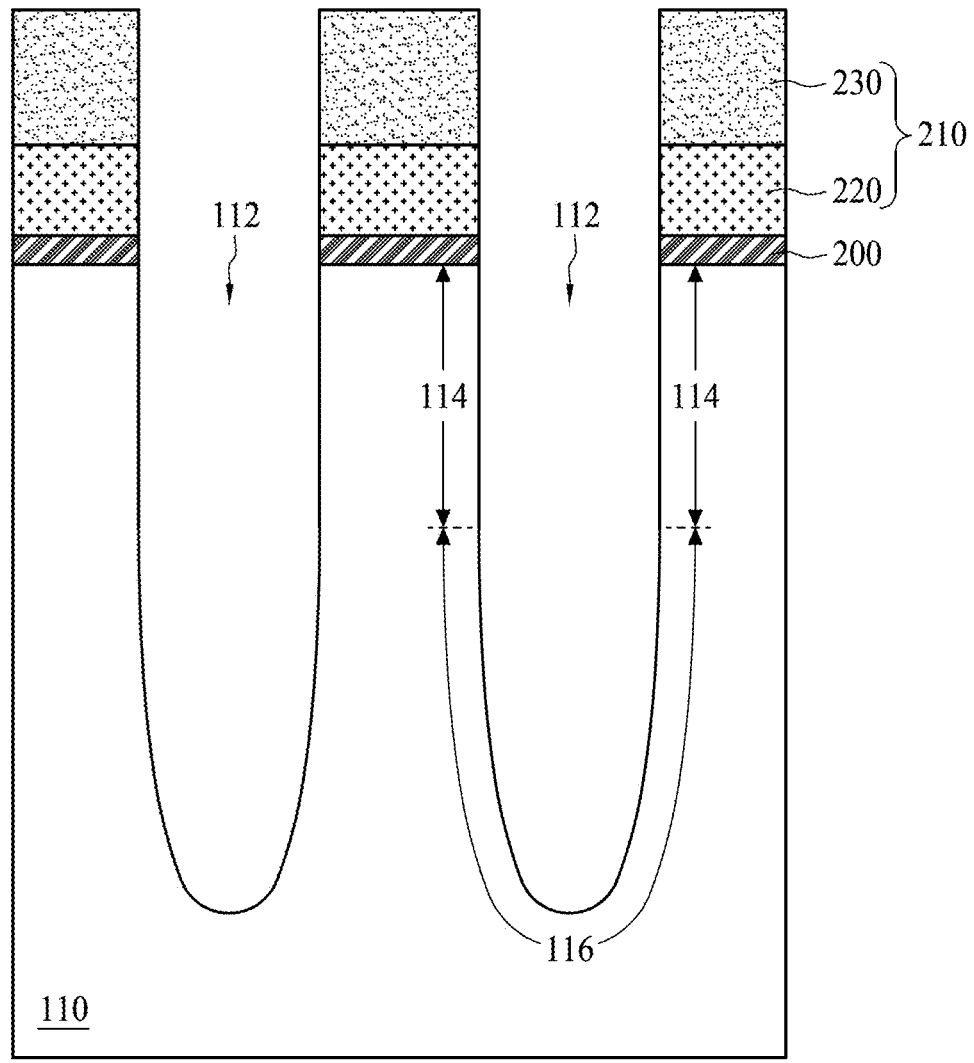

Referring to FIG. 6, the buffer layer 200 and the substrate 110 are sequentially etched through the openings 212 to form one or more trenches 112 penetrating through the buffer layer 200 and extending into the substrate 110 according to a step S306 in FIG. 2. The substrate 110 and the buffer layer 200 are anisotropically dry-etched, using a reactive ion etching (RIE) process, for example, through the openings 212 to form the trenches 112 in the substrate 110, so that the width in the opening 212 is maintained in the trenches 112. In some embodiments, bottoms of the trenches 112 may be optionally rounded to reduce defect density and reduce electric field concentration during the operating of the device. In some embodiments, corner effects may be avoided if the trenches 112 are U-shape trenches.

As shown in FIG. 6, the trench 112 can include an upper segment 114, proximal to the sacrificial layer 210 and having a uniform width, and a lower segment 116, away from the sacrificial layer 210 and having a tapering width. In other words, the sidewall of the substrate 110 in the upper segment 114 of the trench 112 is substantially a vertical plane, while the sidewall of the substrate 110 in the lower segment 116 of the trench 112 is a sloped surface, which transitions into the vertical plane. In some embodiments, the upper segment 114 of the trench 112 is wider than the bottom segment 116 thereof.

Figure 7:
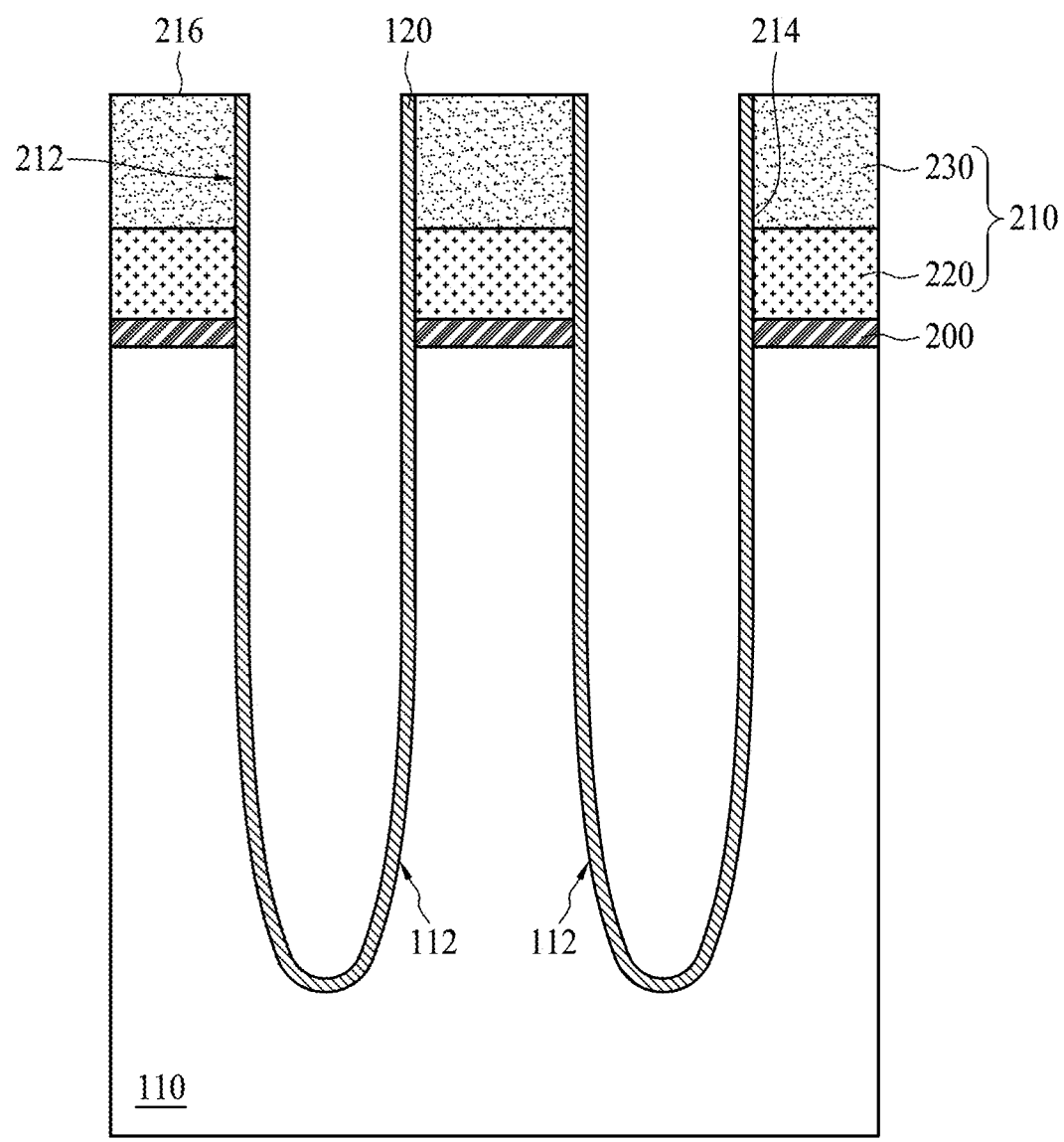

Referring to FIG. 7, a dielectric film 120 is formed on an exposed portion of the substrate 110 according to a step S308 in FIG. 2. The dielectric film 120, having a substantially uniform thickness, covers the exposed portion of the substrate 110, but does not fill the trench 112. In some embodiments, the dielectric film 120 and the buffer layer 200 can include the same material, but the present disclosure is not limited thereto. In some embodiments, the dielectric film 120 may be grown on the exposed portion of the substrate 110 using a thermal oxidation process. In alternative embodiments, the dielectric film 120 is disposed not only on the exposed portion of the substrate 110 but also on exposed portions of the buffer layer 200 and the sacrificial layer 210. By way of example, the dielectric film 120 includes oxide, nitride, oxynitride or high-k material and can be deposited using a CVD process, an ALD process, or the like. In some embodiments, the dielectric film 120 deposited on a topmost surface 216 of the sacrificial layer 210 may be removed using an etching process, for example, while the dielectric film 120 deposited on a sidewalls 214 of the sacrificial layer 210 is left in place.

Figure 8:
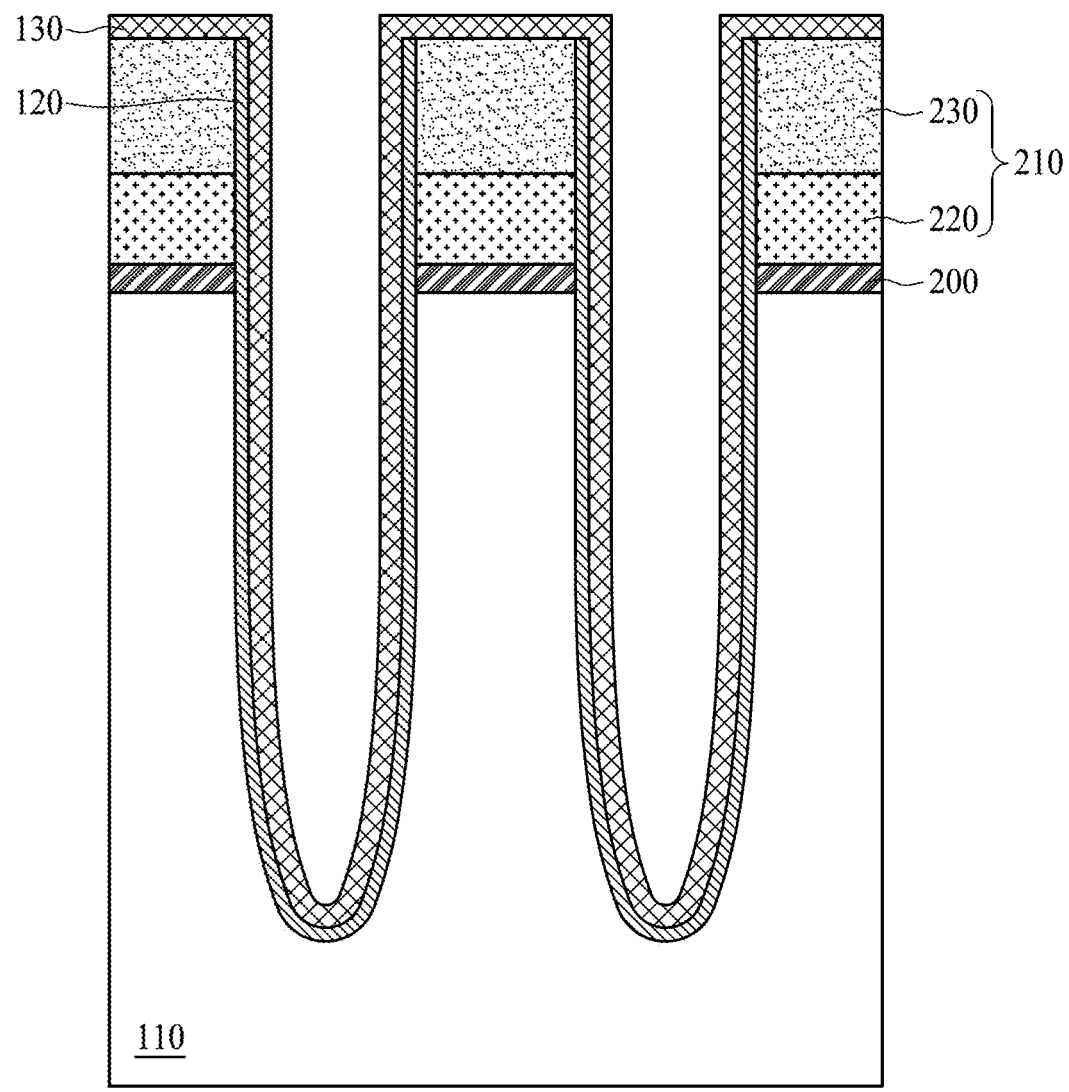

Referring to FIG. 8, a diffusion barrier layer 130 is optionally deposited on the dielectric film 120 according to a step S310 in FIG. 2. The diffusion barrier layer 130 may further be deposited on the portion of the sacrificial layer 210 exposed through the dielectric film 120. The diffusion barrier layer 130, having a substantially uniform thickness, covers the dielectric film 120, but does not fill the trench 112. In order to secure the step coverage, the diffusion barrier layer 130 can be formed using a PVD process or an ALD process, for example, wherein the diffusion barrier layer 130 deposited using the ALD process is highly uniform in thickness. In some embodiments, the diffusion barrier layer 130 may be a single-layered structure including refractory metals (such as tantalum and titanium), refractory metal nitrides, or refractory metal silicon nitrides. In alternative embodiments, the diffusion barrier layer 130 may comprise a multi-layered structure including one or more refractory metals, refractory metal nitrides, or refractory metal silicon nitrides.

Figure 9:
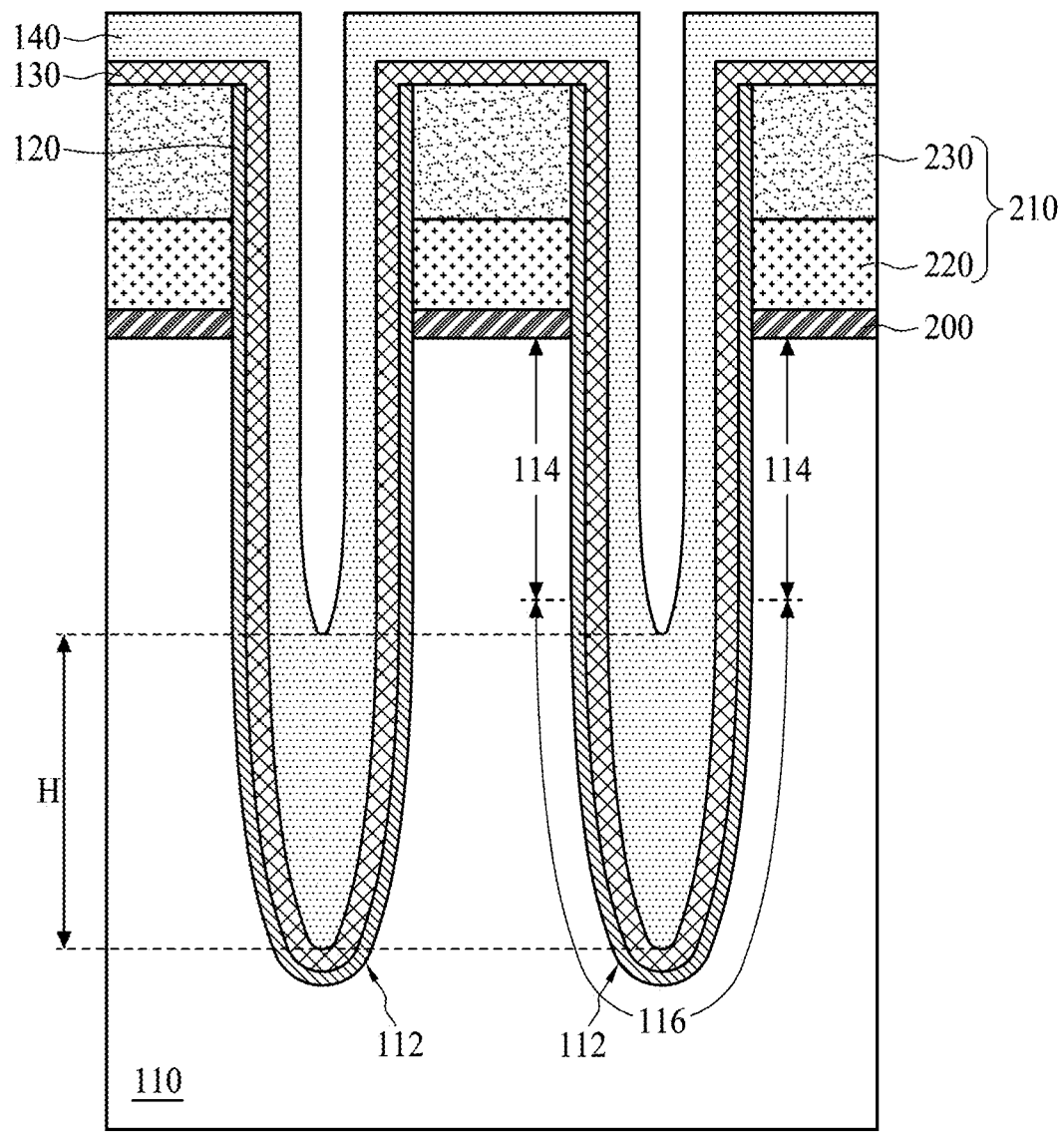

Referring to FIG. 9, a conductive material 140 is deposited to partially fill the trench 112 according to a step S312 in FIG. 2. The conductive material 140 is conformally and uniformly deposited over the dielectric film 120. Due to the directionality in the deposition of the conductive material 140 toward the bottom of the trench 112, the rate of deposition of the conductive material 140 at the lower segment 116 of the trench 112 is greater than the rate of deposition of the conductive material 140 at the upper segment 114 of the trench 112. As a result, the thickness of the conductive material 140 at the lower segment 116 of the trench 112 is significantly greater than the thickness of the conductive material 140 at upper segment 114 of the trench 112. In some embodiments, the deposition of the conductive material 140 stops when the conductive material 140 deposited in the trench 112 reaches a predetermined thickness H, which can circumvent the detrimental short-channel effect and improve the device reliability. The conductive material 140 includes polysilicon or metal, such as tungsten, aluminum, copper, molybdenum, titanium, tantalum, ruthenium, or a combination thereof. The conductive material 140 may be formed using a CVD process, a PVD process, an ALD process or another suitable process.

Figure 10:
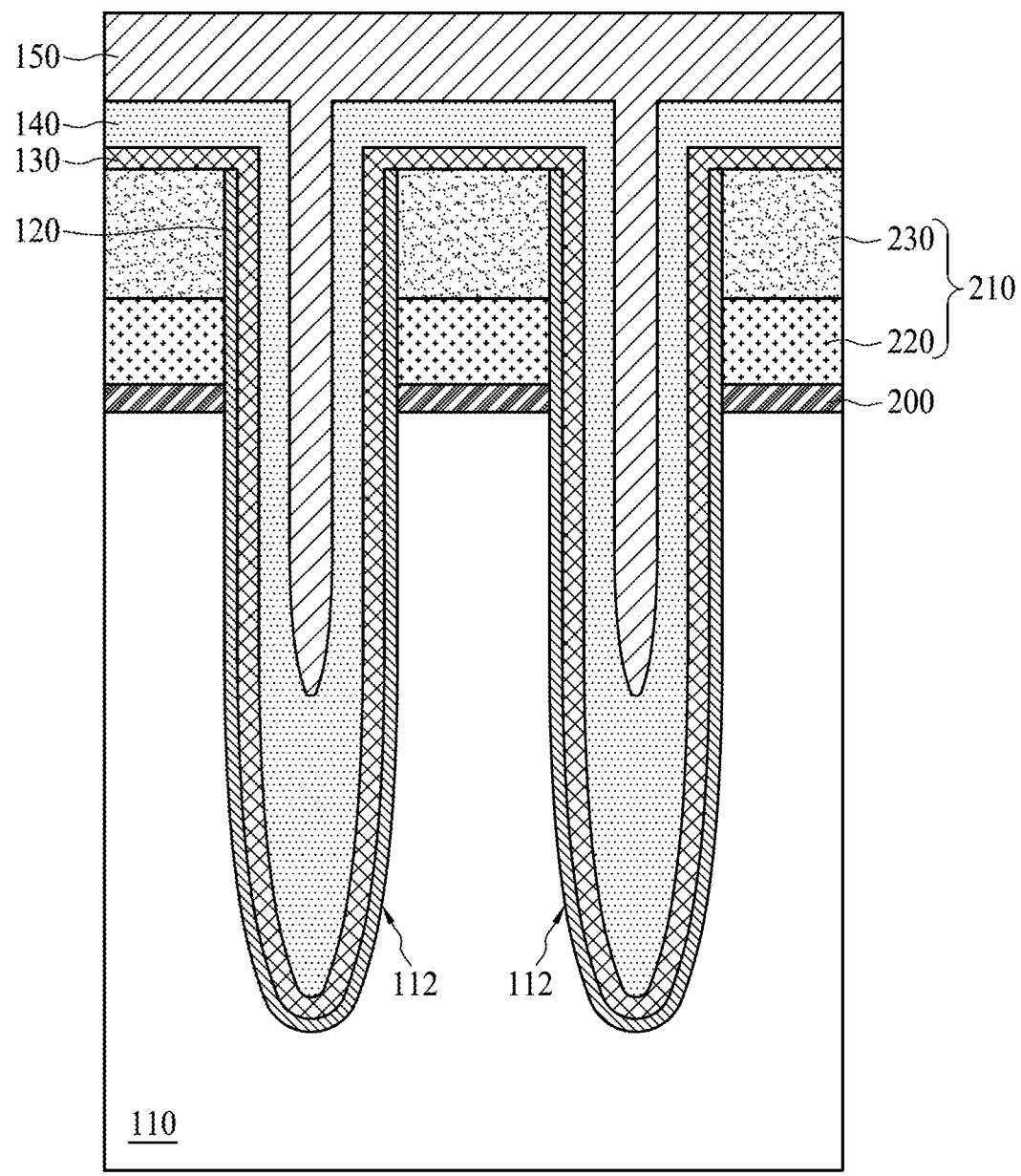

Referring to FIG. 10, an insulative material 150 is deposited to fill the trench 112 according to a step S314 in FIG. 2. Consequently, the conductive material 140 is buried in the insulative material 150. The insulative material 150 has a sufficient thickness to fill the trench 112. The insulative material 150, including nitride, is formed using a (plasma) CVD process. In some embodiments, the insulative material 150 can include silicon nitride. In some embodiments, the insulative material preferably includes a material having a high etching selectivity to the dielectric layer 120, the diffusion barrier layer 130 and the conductive material 140.

Figure 11:
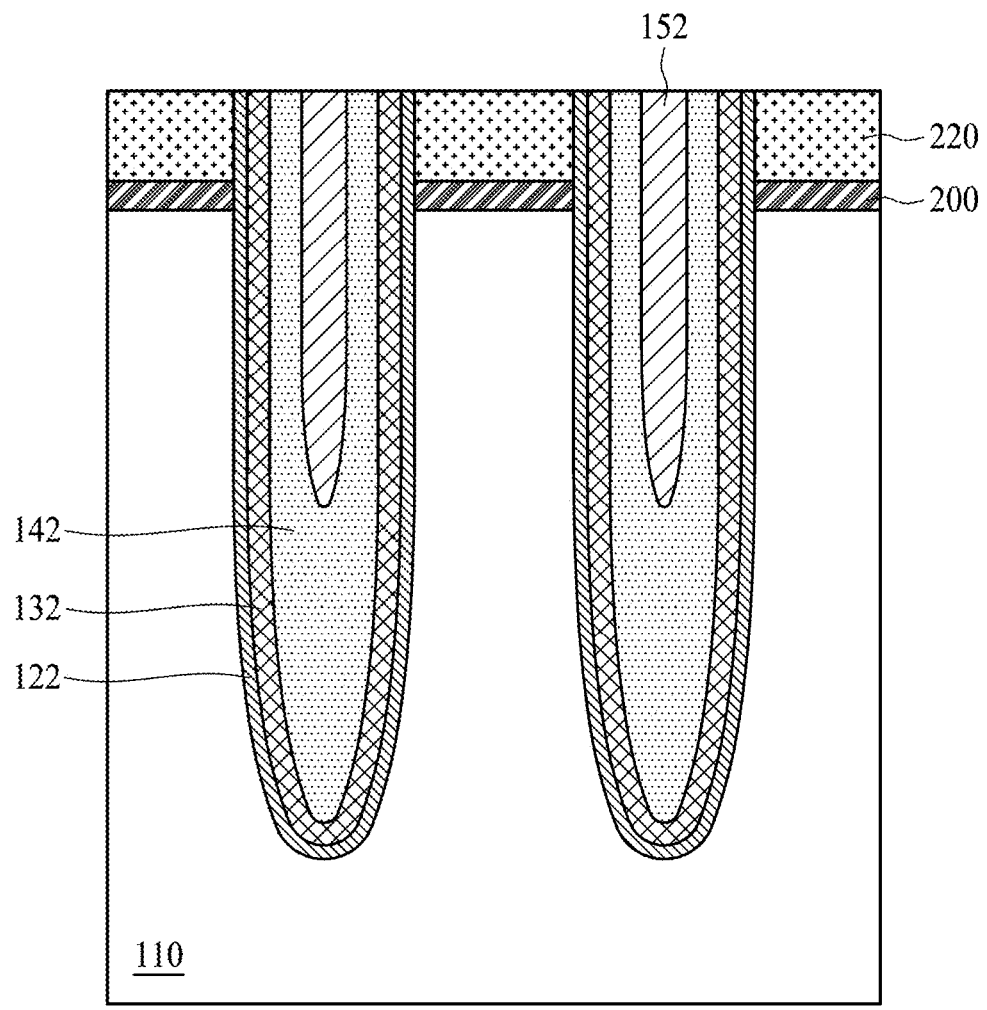
Figure 12:
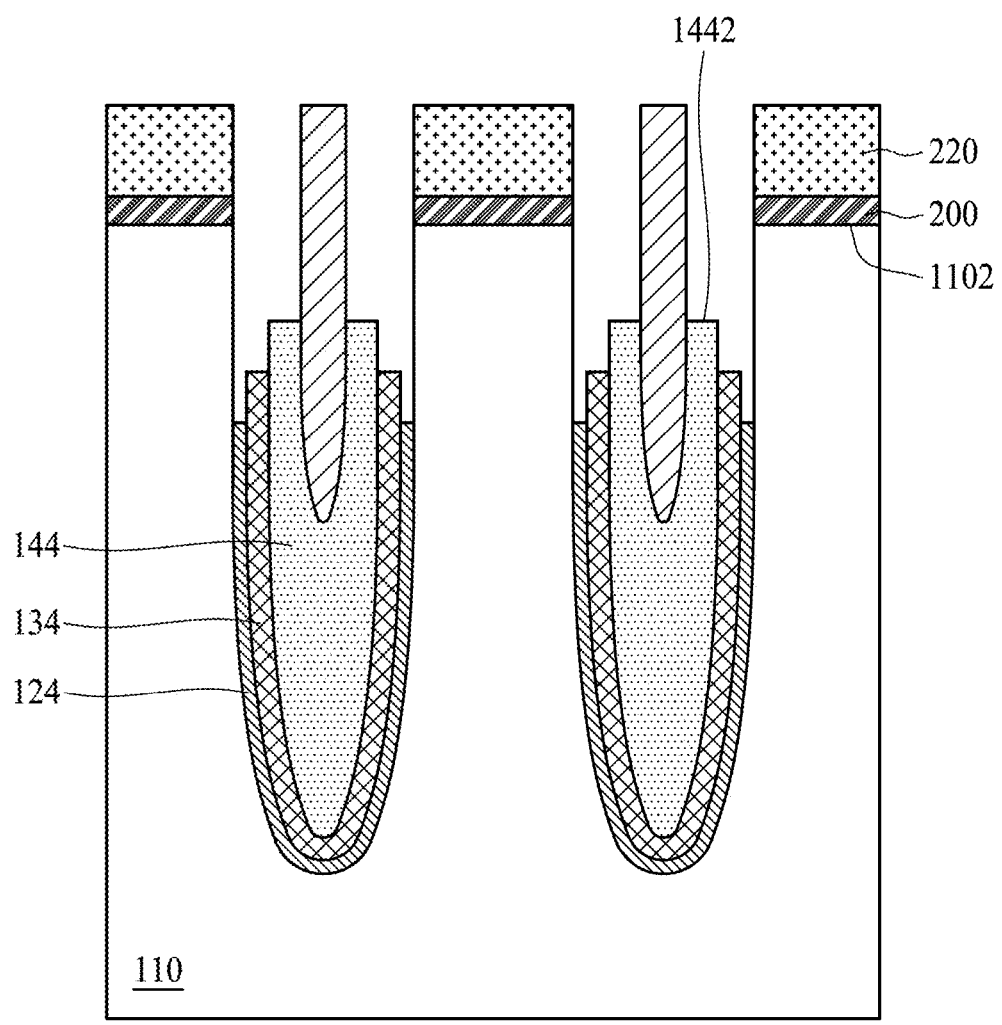

Referring to FIGS. 11 and 12, the conductive material 140 is recessed below the upper surface 1102 of the substrate 110 according to a step S316 in FIG. 2. Consequently, a plurality of word lines 144 are formed. The formation of the word lines 144 includes (1) performing one or more removal processes, including a polishing process and/or an etching process, to remove the overlying layer 230 and portions of the insulative material 150, the conductive material 140, the diffusion barrier layer 140 and the dielectric film 130 above the underlying layer 220, and (2) etching the remaining conductive material 142 shown in FIG. 11 until it is below the upper surface 1102 of the substrate 110. As shown in FIG. 11, the word lines 144 have a top surface 1442 below than the upper surface 1102. After the one or more removal processes, the underlying layer 220 is exposed, and a remaining dielectric film 122, a remaining diffusion barrier layer 132, a remaining conductive layer 142, and a plurality of insulative pieces 152 are formed. In some embodiments, the remaining diffusion barrier layer 132 and the remaining dielectric film 122, shown in FIG. 11, can be sequentially recessed below the top surface 1442 of the word lines 142. Consequently, a plurality of dielectric liners 124 and a plurality of diffusion barrier liners 134 between the substrate 110 and the word lines 144 are formed. In some embodiments, the insulative pieces 152 are left without being etched after the recessing processes.

Figure 13A:
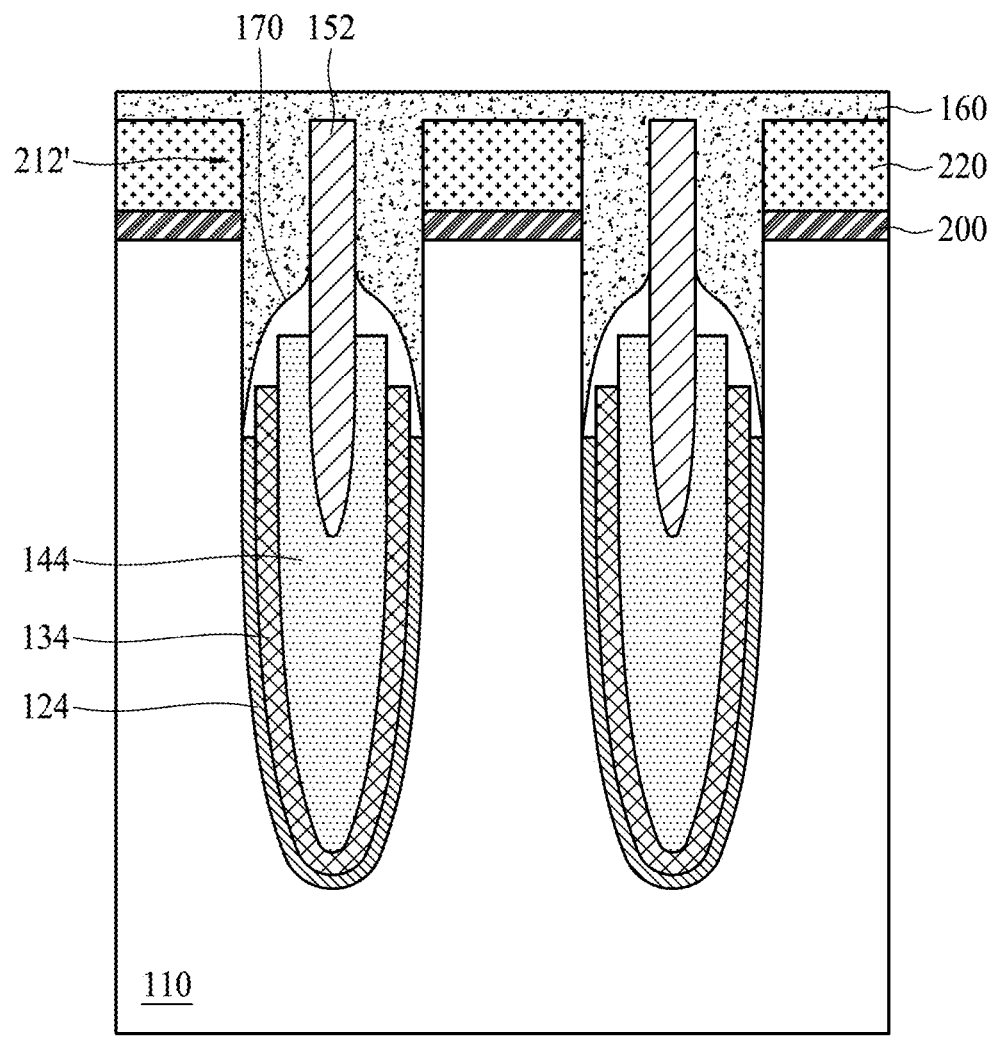
FIG. 13A illustrates cross-sectional views of intermediate stages in the formation of a semiconductor device in accordance with some embodiments of the present disclosure.
Figure 13B:
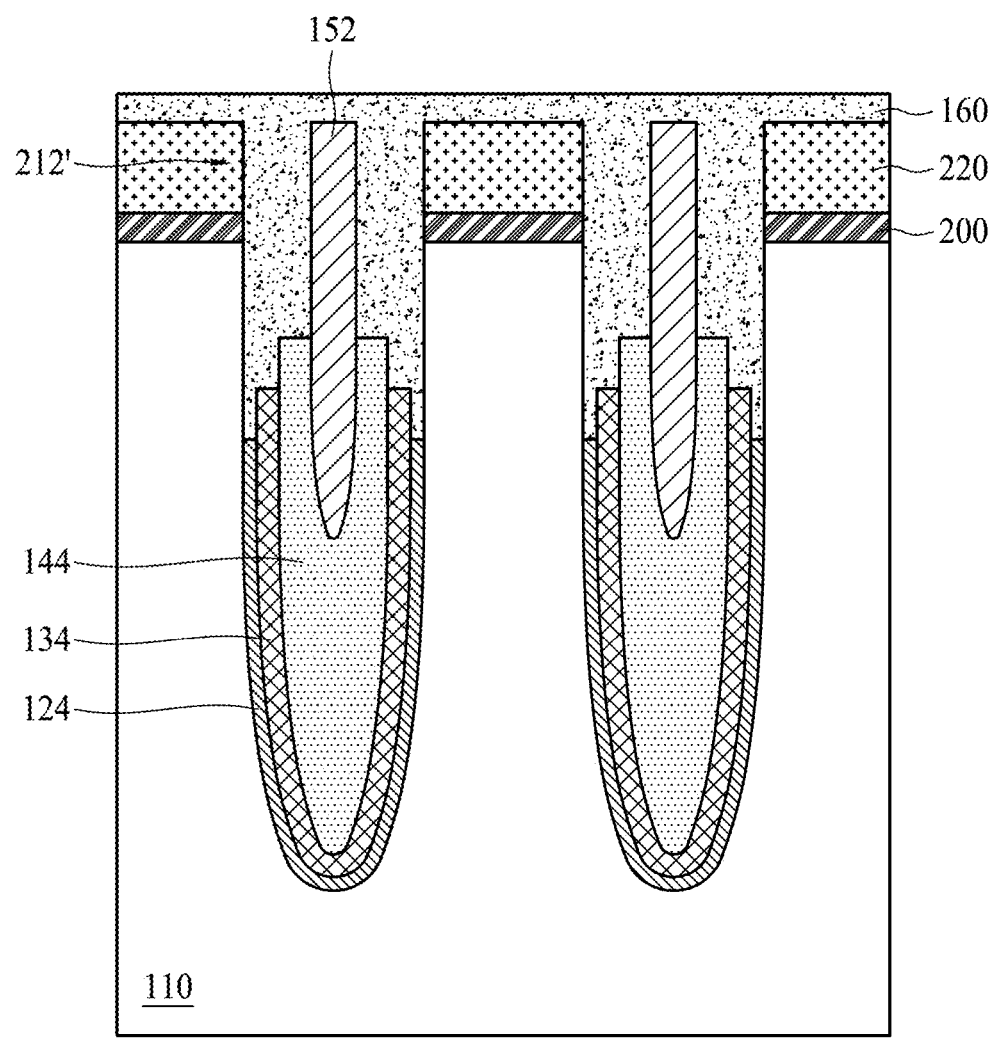
FIG. 13B illustrates cross-sectional views of intermediate stages in the formation of a semiconductor device in accordance with some embodiments of the present disclosure.

Referring to FIGS. 13A and 13B, an isolation material 160 is deposited to at least partially fill the trenches 112 according to a step S318 in FIG. 2. The isolation material 160 is conformally and uniformly deposited in the trench 112 and over the insulative pieces 152 and the underlying layer 220. Because the insulative piece 152 narrows the width of the trench 112, one or more voids 170, holding an ambient gas (such as air), can be formed in the isolation material 160 to reduce the effective dielectric constant of the isolation material 160. As shown in FIG. 13A, the void 170 is formed around the insulative piece 152. In some embodiments, the isolation material 160 may completely fill openings 212' in the underlying layer 220 and the trenches 112 in the substrate 110, as shown in FIG. 13B. The isolation material 160 can be deposited using a CVD process or an ALD process, wherein the ALD process has a good coverage to form the void-free isolation material 160 shown in FIG. 13B. In some embodiments, the voids 170 can be introduced in the isolation material 160 by adjusting the deposition rate of the isolation material 160. In detail, the isolation material 160 cannot completely fill the trenches 112 when the isolation material 160 is deposited at a rapid rate. In some embodiments, the isolative material 160 may include silicon oxide, silicon nitride, silicon oxynitride, hafnium dioxide or zirconium dioxide.

Figure 14A:
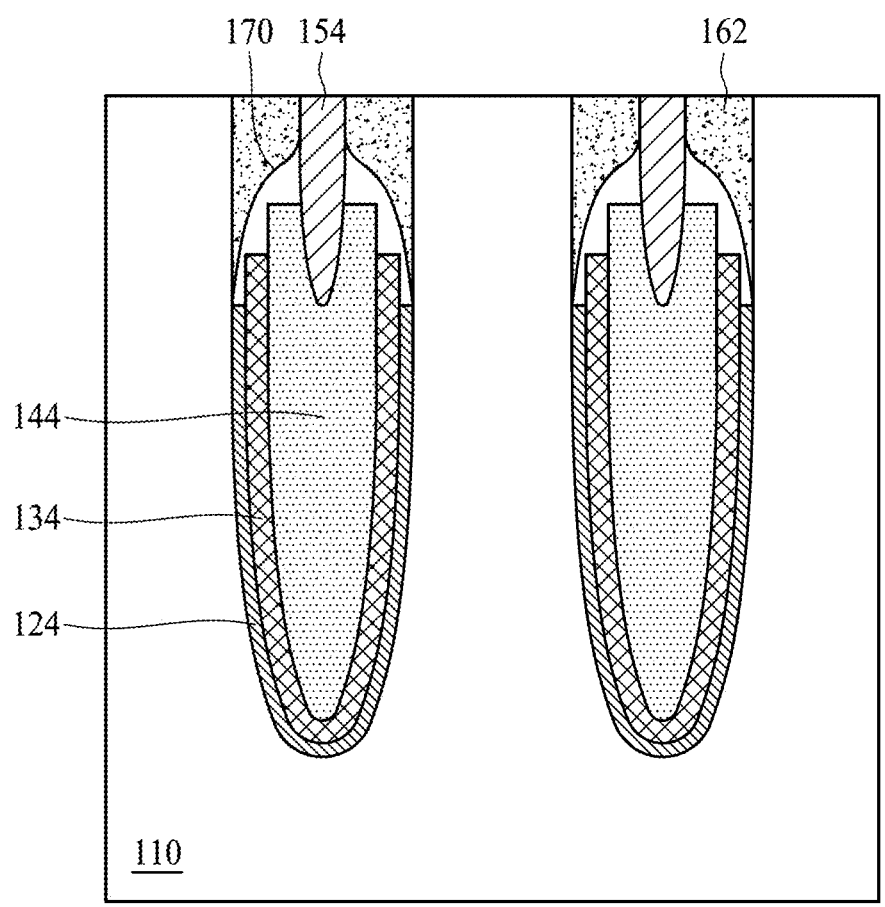
FIG. 14A illustrates cross-sectional views of intermediate stages in the formation of a semiconductor device in accordance with some embodiments of the present disclosure.
Figure 14B:
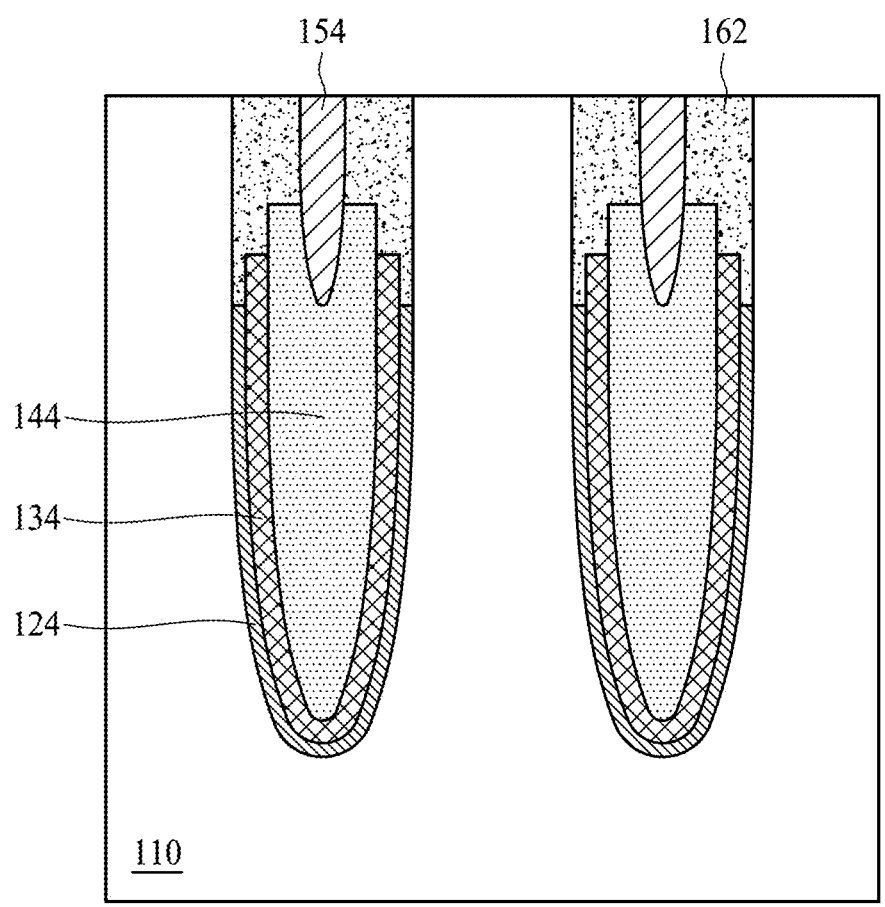
FIG. 14B illustrates cross-sectional views of intermediate stages in the formation of a semiconductor device in accordance with some embodiments of the present disclosure.

Referring to FIGS. 14A and 14B, after the deposition of the isolation material 160, one or more removal processes, including etching processes and/or polishing processes, are performed to remove the superfluous isolation material 160, the underlying layer 210, the buffer layer 200, and portions of the insulative pieces 152, thereby exposing the substrate 110 and forming an isolation layer 162 capping the word lines 144 and a plurality of insulative plugs 154 penetrating through the isolation layer 162 and extending into the word lines 144.

Figure 15A:
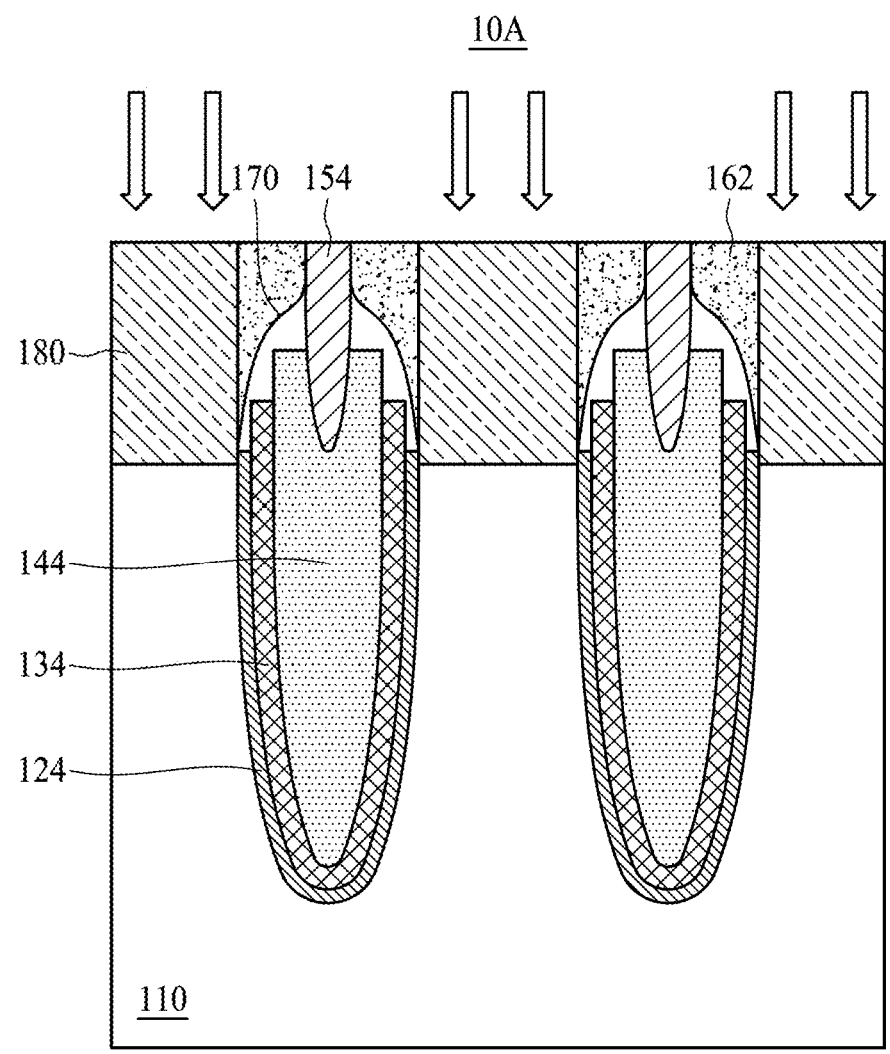
FIG. 15A illustrates cross-sectional views of intermediate stages in the formation of a semiconductor device in accordance with some embodiments of the present disclosure.
Figure 15B:
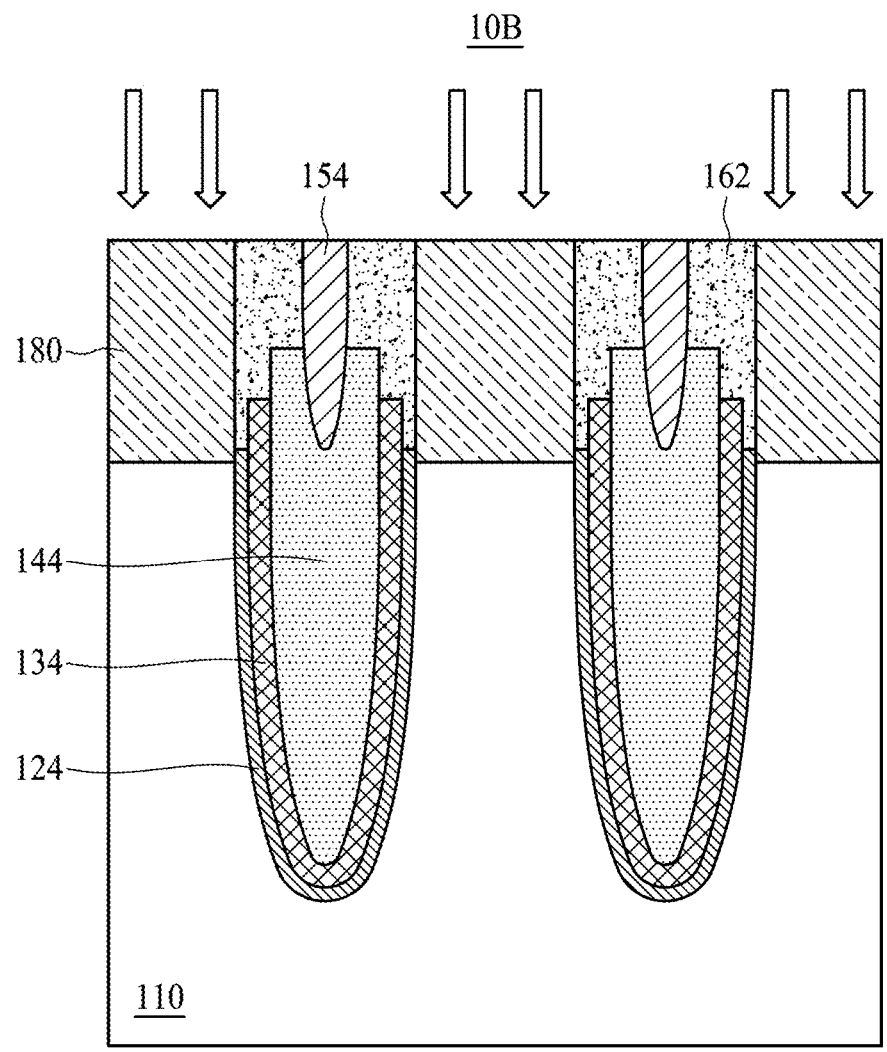
FIG. 15B illustrates cross-sectional views of intermediate stages in the formation of a semiconductor device in accordance with some embodiments of the present disclosure.

Referring to FIGS. 15A and 15B, dopants are introduced into the substrate 110 to form impurity regions 180 on either side of the word lines 144 according to a step S320 in FIG. 2. Accordingly, the semiconductor devices 10A/10B are completely formed. The impurity regions 180 can serve as source/drain regions of the transistor. The introduction of the dopants into the substrate 110 is achieved by a diffusion process or an ion-implantation process. The dopant introduction may be performed using boron or indium if the respective transistor is a p-type transistor, or may be performed using phosphorous, arsenic, or antimony if the respective transistor is an n-type transistor.

One aspect of the present disclosure provides a semiconductor device. The semiconductor device includes a substrate, a word line disposed in the substrate, a dielectric liner disposed between the substrate and the word line, an isolation layer disposed in the substrate to cap the word line, and an insulative plug penetrating through the isolation layer and extending into the word line.

One aspect of the present disclosure provides a method of manufacturing a semiconductor device. The method comprises steps of creating at least one trench in a substrate; depositing a conductive material to partially fill the trench; and forming an insulative piece in the trench and extending into the conductive material.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor device, comprising:
   a substrate;
   a word line disposed in the substrate;
   a dielectric liner disposed between the substrate and the word line;
   an isolation layer disposed in the substrate to cap the word line; and
   an insulative plug penetrating through the isolation layer and extending into the word line.

2. The semiconductor device of claim 1, wherein the insulative plug and the word line are concentric.

3. The semiconductor device of claim 1, wherein the word line has a first width, and the insulative plug has a second width less than the first width.

4. The semiconductor device of claim 3, wherein the second width gradually decreases at positions of increasing distance from an upper surface of the substrate.

5. The semiconductor device of claim 1, wherein the insulative plug is entirely surrounded by the isolation layer.

6. The semiconductor device of claim 1, wherein the insulative plug has a first dielectric constant, and the isolation layer has a second dielectric constant greater than the first dielectric constant.

7. The semiconductor device of claim 1, further comprising a void introduced in the isolation layer.

8. The semiconductor device of claim 7, wherein the void extends around a perimeter of the insulative plug.

9. The semiconductor device of claim 1, further comprising a plurality of impurity regions in the substrate and disposed on either side of the word line.

* * * * *